United States Patent [19]

Abe

[11] Patent Number: 5,291,197
[45] Date of Patent: Mar. 1, 1994

[54] ONE-CHIP DATA PROCESSOR WITH BUILT-IN A/D CONVERTER FOR AUTOMATICALLY REPEATING A/D CONVERSIONS WITHOUT INSTRUCTIONS FROM A CPU

[75] Inventor: Hideo Abe, Tokyo, Japan
[73] Assignee: NEC Corporation, Tokyo, Japan
[21] Appl. No.: 57,866
[22] Filed: May 7, 1993

Related U.S. Application Data

[63] Continuation of Ser. No. 852,908, Mar. 18, 1992, which is a continuation of Ser. No. 378,967, Jun. 12, 1989, abandoned.

[30] Foreign Application Priority Data

Jul. 13, 1988 [JP] Japan ............................... 63-175806

[51] Int. Cl.⁵ .......................... G06F 3/00; H03M 1/12
[52] U.S. Cl. ............................. 341/141; 364/DIG. 2; 364/926; 364/927.8; 364/948.1; 395/800; 341/155
[58] Field of Search .................. 395/800; 341/141, 155

[56] References Cited

U.S. PATENT DOCUMENTS 4,839,795  6/1989  Iwaksaki ............................. 364/200

OTHER PUBLICATIONS

Yager, Charles, *Electronic Design*, "Data-Acquisition System Fits on a Smart Peripheral Chip", vol. 35, No. 5, Mar. 5, 1987.
Yager, Charles and O'Hara, Harlan, *Electronics & Wireless World*, "Single-Chip Data Acquisition Subsystem", vol. 93, No. 1620, Oct. 1987.
Crescenzo, *Electronique Industrielle*, "Microcontroleur 16 Bits", No. 20, May 1988, pp. 28–33.

*Primary Examiner*—Eddie F. Chan
*Attorney, Agent, or Firm*—Foley & Lardner

[57] ABSTRACT

A data processing unit according to the present invention has a central processing unit, and an analog-to-digital converter circuit associated with a plurality of input nodes respectively supplied with analog signals. The analog-to-digital converter circuit is established in one of three modes of operations, i.e., a fixed mode of operation for focusing the A/D converting operation on one analog signal of a specified input node, a scanning mode of operation for sequentially converting the analog signals into corresponding digital signals and a mixed mode of operation for performing the fixed mode of operation once or a predetermined number of times before automatically returning to the scanning mode of operation, so that the central processing unit does not need to shift the analog-to-digital converter circuit from the fixed mode to the scanning mode if the mixed mode is selected, thereby improving the throughput of the central processing unit.

11 Claims, 4 Drawing Sheets

ONE-CHIP DATA PROCESSOR WITH BUILT-IN A/D CONVERTER FOR AUTOMATICALLY REPEATING A/D CONVERSIONS WITHOUT INSTRUCTIONS FROM A CPU

This application is a continuation of application Ser. No. 07/852,908, filed Mar. 18, 1992, which is a continuation of Ser. No. 07/378,967, filed on Jul. 12, 1989, now abandoned.

FIELD OF THE INVENTION

This invention relates to a one-chip data processor such as a microprocessor or a microcomputer and, more particularly, to a built-in A/D (analog-to-digital) converter circuit fabricated on the same semiconductor chip.

DESCRIPTION OF THE RELATED ART

The dimensions of these devices have been scaled down by progressive improvement in manufacturing techniques, and, accordingly, the component elements per chip have increased in number. Thus, a complex circuit is realized on a single semiconductor chip, and a semiconductor chip tends to be shared by peripheral circuits and a microprocessor. For example, an A/D converter circuit is a popular and important peripheral circuit for automotive usage as well as for servomechanisms, and is frequently provided in association with a microprocessor. Thus, the A/D converter circuit is combined with the microprocessor in various applications, and a one-chip microprocessor with built-in A/D converter circuit is developed for those applications.

FIG. 1 shows a typical example of the one-chip microprocessor with built-in A/D converter circuit. A semiconductor chip 1 is shared by a central processing unit 2 and an A/D converter circuit 3, which are communicable with each other through an internal bus system 4. The central processing unit 2 sequentially fetches programed instruction codes and executes them for data processing upon data supplied from or to the A/D converter circuit, and the A/D converter circuit 3 drives an interrupt signal line 5 for requesting an interrupt service routine.

The A/D converter circuit 3 largely comprises a plurality of input nodes 6, 7, 8, 9, 10, 11, 12 and 13, an analog multiplexer 14, an A/D converting unit 15, a plurality of registers 16, 17, 18, 19, 20, 21, 22 and 23, and a controlling unit 24. The input nodes 6 to 13 are coupled in parallel to outside signal generators (not shown) such as sensor units which independently produce analog voltage signals. The analog multiplexer is responsive to a multiple-bit selecting signal on signal lines 25, and is transparent to one of the analog voltage signals. The analog voltage signal passing through the analog multiplexer 14 is supplied to the A/D converting unit 15, and is, then, converted into a digital signal tantamount in value to the analog voltage signal. The digital signal thus produced is supplied to one of the registers 16 to 23 assigned by an address signal on address signal lines 26, and is memorized thereinto. When predetermined A/D converting operations are completed, the controlling unit 24 produces an interrupt requesting signal which is transferred through the interrupt signal line 5 to the central processing unit 2. With the interrupt requesting signal, the central processing unit 2 is branched to the interrupt service routine, and fetches the data bits memorized in the registers 16 to 23 in the digital form for processing.

Thus, the controlling unit 24 not only provides a timing for the interrupt service routine but also supervises the multiplexer 14 associated with the A/D converting unit 15 and the registers 16 to 23, and, for this purpose, is provided with two registers 27 and 28. The register 27 is used for producing the selecting signal, and a node-selection code is stored in the register 27 for steering the operations of the multiplexer 14. On the other hand, the register 28 stores a function code which defines the function of the A/D converter circuit 3. Both of the registers 27 and 28 are accessible for the central processing unit 2, and, accordingly, the node-selecting code and the function code are supplied from the central processing unit 2 to the registers 27 and 28, respectively.

The A/D converter circuit 3 usually has two modes of operation, i.e., a fixed mode of operation and a scanning mode of operation, depending upon the function code. In the fixed mode of operation, the node-selecting code is fixedly stored in the register 27 throughout the operation, and, for this reason, the multiplexer 14 transfers an analog voltage signal on the input node specified by the node selecting code to the A/D converting unit 15. On the other hand, the node-selecting code is periodically changed so as to scan the input nodes 6 to 13 in the scanning mode of operation, and the multiplexer 14 is sequentially transparent for all of the input nodes 6 to 13, thereby allowing all of the analog voltage signals to be supplied to the A/D converting unit 15. These two modes of operation are directly related to the starting point of the present invention, so that a description is hereinbelow made for the fixed mode of operation, as well as the scanning mode of operation, under separate sub-titles.

Fixed Mode of Operation

When the function code has value "0", the fixed mode of operation is established in the A/D converter circuit 3. Accordingly, the A/D converting unit 15 continuously converts the analog voltage signal on one of the input nodes 6 to 13 specified by the node-selecting code in the register 27. The value of the node-selecting code indicates the location of the specified input node. Namely, when the node selecting code has value of "5", the multiplexer 14 transfers the analog voltage signal on the input node 11 to the A/D converting unit 15, however, if value of "7" is assigned to the node-selecting code, the analog voltage signal on the input node 13 passes through the multiplexer 14 and reaches the A/D converting unit 15. After the A/D conversion, the digital signal is supplied to one of the registers 16 to 23. Since the registers 16 to 23 are associated with the input nodes 6 to 13, respectively, the digital signal is memorized in the associated register. For example, when the input node 11 is specified by the node-selecting code, the digital signal is stored in the register 21. However, if the input node 13 is selected by the code, the register 23 is continuously used for the digital signal.

Thus, the A/D converting unit 15 fixes the converting operation to one of the analog voltage signals, and produces a series of digital signals. As described hereinbefore, only one associated register is used for the digital signals, and, for this reason, the controlling unit 24 periodically produces the interrupt requesting signal after the completion of every single A/D converting operation.

Scanning Mode of Operation

The scanning mode of operation is representative of the function code of "1", and the A/D converting unit 15 repeats the A/D converting operation for the input nodes 6 to 13.

In detail, the scanning mode of operation starts with memorizing the function code of "1" supplied from the central processing unit 2. Whenever the scanning mode of operation is established in the A/D converter circuit 3, the node-selecting code supplied from the central processing unit 2 is made invalid, and the controlling unit 24 sequentially supplies the multiplexer 14 with the selecting signals for steering the analog voltage signals on the input nodes 6 to 13. Namely, the analog voltage signal on the input node 6 is firstly transferred to the A/D converting unit 15 to produce a digital signal, and the digital signal is relayed to the register 16. Next, the multiplexer 14 becomes transparent for the analog voltage signal on the input node 7, so that the analog voltage signal is converted into a digital signal by the A/D converting unit 15, then memorizing the digital signal into the register 17. In this manner, the controlling unit 24 sequentially requests the multiplexer 14 to transfer all of the analog voltage signals to the A/D converting unit 15, and the A/D converting unit 15 repeats the A/D converting operation for filling the registers 16 to 23 with the digital signals. When the A/D converting operation is completed for the analog voltage signal on the input node 13, the controlling unit 24 produces the interrupt requesting signal, and the interrupt signal line 5 propagates the requesting signal to the central processing unit 2. However, no job is assigned to the central processing unit 2 upon the receipt of the interrupt requesting signal, and, for this reason, the interrupt requesting signal is masked in the central processing unit 2. After the completion of a set of the A/D converting operations is reported by the interrupt requesting signal, the controlling unit 24 causes the multiplexer 14 to return to the analog voltage signal of the input node 6.

In the practical operation, the fixed mode of operation is mixed with the scanning mode of operation. Assuming now that the A/D converter circuit remains in the scanning mode of operation, the controlling unit 24 allows the multiplexer 14 to sequentially transfer the analog voltage signals on the input nodes 6 to 13 for producing the digital signal or the digital codes, and the digital codes are memorized in the registers 16 to 23, respectively. However, while sequentially executing the programmed instructions, an A/D conversion subroutine call takes place, and the central processing unit 2 needs to fetch one of the latest digital data codes stored in the registers 16 to 23. The central processing unit 2 writes the function code of "0" into the register 28, and, then, the register 27 is, by way of example, supplied with the node-selecting code representative of one of the input nodes 6 associated with the necessary digital code. With the function code of "0", the A/D converter circuit 3 is shifted to the fixed mode of operation, and the multiplexer 14 transfers the analog voltage signal on the input node 6 to the A/D converting unit 15. The analog voltage signal is converted to the digital code, and is relayed to the register 16 as the latest data code. When the digital code is memorized in the register 16, the interrupt requesting signal is supplied from the controlling unit 24 to the central processing unit 2. With the interrupt requesting signal, the central processing unit 2 fetches the digital code in the register 16, and executes programmed instructions for the latest digital code. Thus, the central processing unit 2 does not mask the interrupt requesting signal, and repeats the data fetch a certain number of times. After this, the central processing unit 2 puts the function code of "1" in the register 28, and, for this reason, the A/D converter circuit 3 returns to the scanning mode of operation. In the scanning mode of operation, the central processing unit 2 masks the interrupt requesting signal again. The masked state and the non-masked state should be alternatively established in the central processing unit 2.

However, a problem is encountered in the prior art microprocessor with the built-in A/D converter with a relatively low throughput. This is because the central processing unit is involved in the establishment of both operation modes. Namely, when the A/D converter circuit 3 is shifted between the fixed mode of operation and the scanning mode of operation, the central processing unit 2 provides the function code representative of the new mode of operation. Moreover, after the masked state is established in the scanning mode of operation, the mask should be removed from the interrupt requesting signal in the fixed mode of operation. These jobs consume a substantial amount of time, and, for this reason, the throughput deteriorates in the central processing unit 2.

SUMMARY OF THE INVENTION

It is therefore an important object of the present invention to provide a one-chip microprocessor with a built-in A/D converter with is improved throughput.

It is also an important object of the present invention to provide a one-chip microprocessor with a built-in A/D converter which automatically returns to the scanning mode of operation.

To accomplish these objects, the present invention proposes to provide a third mode of operation for repeating the fixed mode of operation a predetermined number of times before automatically returning to the scanning mode of operation.

In accordance with the present invention, there is provided a data processor fabricated on a single semiconductor chip, comprising:

a) an analog-to-digital converter circuit having a-1) a multiplexer responsive to a node-selecting signal and associated with a plurality of input nodes respectively supplied with analog signals, a-2) an analog-to-digital converting unit coupled to the multiplexer and operative to convert the analog signal from the multiplexer into a digital signal, a-3) a plurality of registers coupled to the analog-to-digital converting unit for storing the digital signal in one of the registers assigned by an address signal, and a-4) a controlling unit producing the node-selecting signal, and the address signal as well as an interrupt requesting signal;

b) a central processing unit operative to execute a programmed routine including an interrupt service subroutine for fetching the digital signal stored in the register, the interrupt service routine starting with the interrupt requesting signal; and c) a multiple-bit bus system interconnecting the analog-to-digital converter circuit and the central processing unit, in which the controlling unit has first and second function registers for respectively storing first and second function codes each having a first or second value and supplied from the central processing unit, and is associated with a detecting circuit for detecting whether or not the function code in the second function register has the second value, and in which the first and second function codes with the first value allows the multiplexer to continuously transfer the analog signal on one of the input node to the analog-to-digital converting unit for a fixed analog-to-digital converting operation, and the combination of the first function code with the second value and the second function code with the first value allows the multiplexer to sequentially transfer the analog signals on the respective input nodes to the analog-to-digital converting unit for a scanning analog-to-digital converting operation, however, the combination of the first function code with either value and the second function code with the second value causes the detecting circuit to produce a detecting signal supplied to the controlling unit for performing the fixed analog-to-digital converting operation before automatically returning to the scanning analog-to-digital converting operation.

BRIEF DESCRIPTION OF THE DRAWINGS

The features and advantages of a one-chip microprocessor with built-in A/D converter according to the present invention will be more clearly understood from the following description taken in conjunction with the accompanying drawings in which:

FIG. 3 is a circuit diagram representative of a controlling unit shown in.. FIG. 3.

DESCRIPTION OF THE PREFERRED EMBODIMENTS

First embodiment

Figure 1:
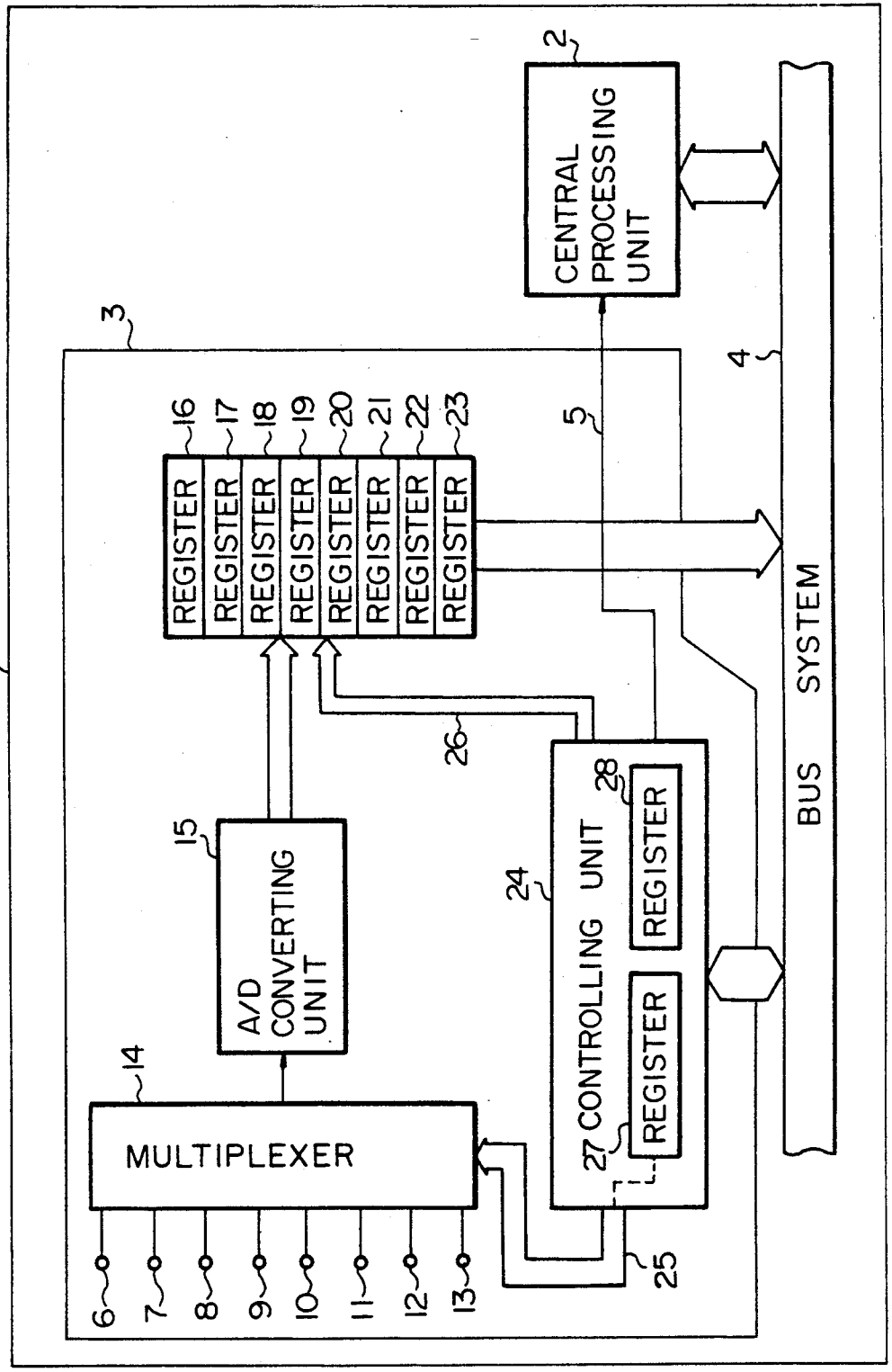
FIG. 1 is a block diagram showing the circuit arrangement of a prior art one chip microprocessor with a built-in A/D converter.
Figure 2:
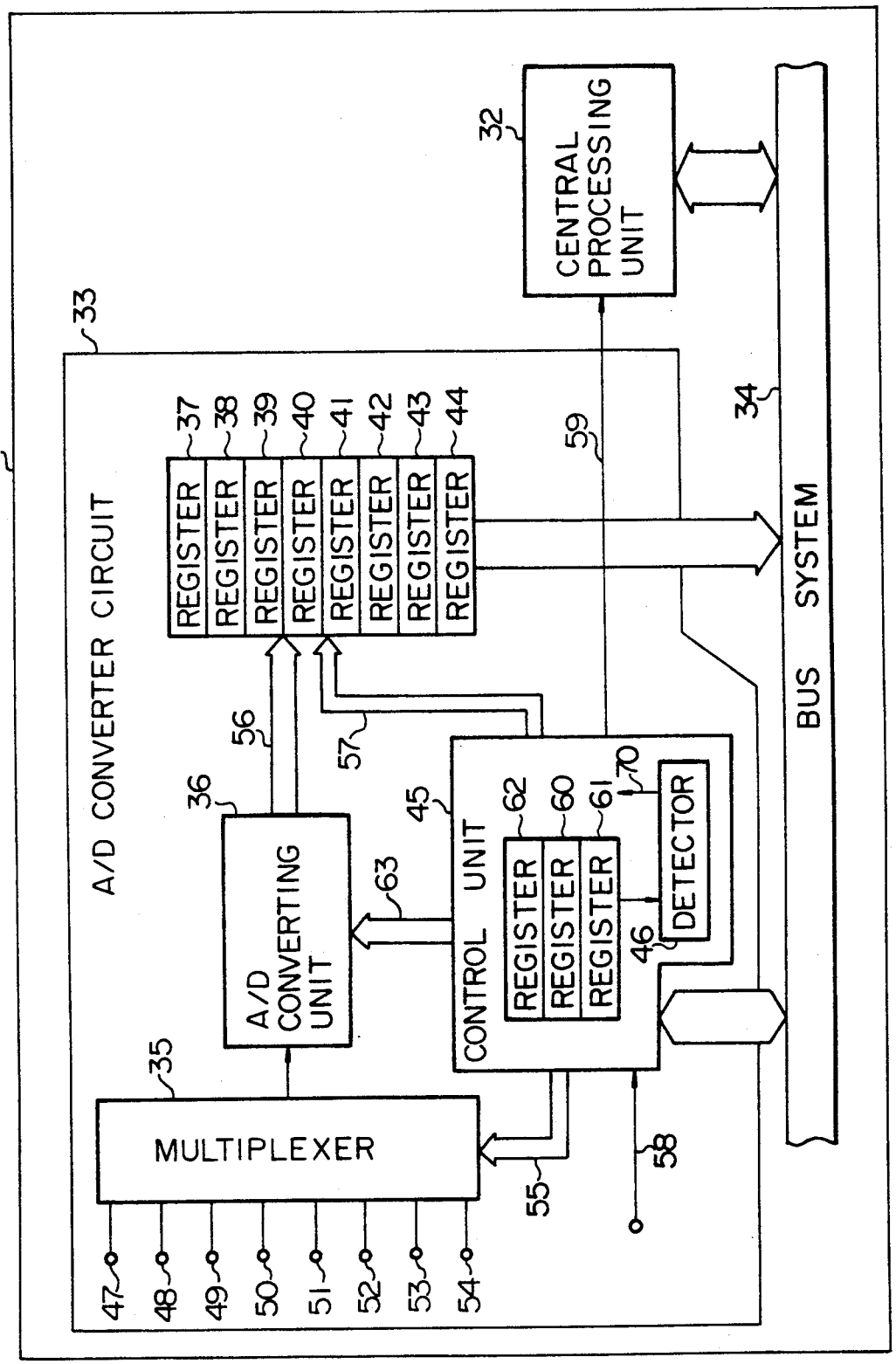
FIG. 2 is a block diagram showing the circuit arrangement of a one-chip microprocessor with a built-in A/D converter embodying the present invention.

Referring first to FIG. 2 of the drawings, a microprocessor with a built-in A/D converter is fabricated on a single semiconductor chip 31. The microprocessor largely comprises a central processing unit 32 and an A/D converter circuit 33 communicable with each other through a multiple-bit bus system 34. The central processing unit 32 is well known in the art, so that no further description is incorporated in the following description. The A/D converter circuit 33 comprises a multiplexer 35, an A/D converting unit 36, a plurality of registers 37, 38, 39, 40, 41, 42, 43 and 44, and a controlling unit 45. The A/D converting circuit 36 is shiftable between a fixed mode of operation and a scanning mode of operation, and both of the operation modes are similar to those of the prior art microprocessor shown in FIG. 1.

The multiplexer 35 is associated with a set of input nodes 47, 48, 49, 50, 51, 52, 53 and 54, and steers analog voltage signals on the input nodes 47 to 54 in response to a selecting signal on selecting signal lines 55. The A/D converting unit 36 is coupled to the registers 37 to 44 through a multiple-bit bus 56 and converts the analog voltages into corresponding digital data bits in response to timing signals supplied from the unit 45 via timing signal lines 63. The converted digital data bits are transferred to the corresponding registers 37 to 44 and memorized therein. The registers 37 to 44 are provided in association with the input nodes 47 to 54, respectively, and the digital signals are assigned to the registers 37 to 44 by an address signal supplied from the controlling unit 45 through an address bus 57. Namely, when the selecting signal, by way of example, specifies the input node 47, the digital data bits are transferred from the A/D converting unit 36 to the register 37, however, if the input node 48 is selected by the signal, the address signal assigns the register 38 to the digital data bits converted from the analog voltage signal on the input node 48. The control unit 45 is supplied through a signal line 58 with a conversion request signal which will be described later in detail. An interrupt requesting signal is supplied from the controlling unit 45 to the central processing unit 32 through an interrupt signal line 59 upon completion of the A/D converting signal or a cycle of the A/D converting operations. The central processing unit 32 is accessible to the digital codes stored in the registers 37 to 44 through the multiple-bit bus system 34.

The controlling unit 45 has two function registers 60 and 61, a node selection register 62, and a detector 46. The node selection register 62 stores a node-selecting code in a rewritable manner, and the selecting signals 55 and 57 are produced on the basis of the node-selecting code.

The function registers 60 and 61 provide a storage for function code, and the contents thereof are controlled by the central processing unit 32. The detector 46 detects that the value of "1" is written into the function register 61 by comparing with a reference code. The central processing unit 32 is accessible to the node-selecting register 62 as well as the function registers 60 and 61 through the bus system 34.

The A/D converter circuit 33 thus constituted has three kinds of operation modes, which will be described hereinbelow, in accordance with the function codes stored int he function registers 60 and 61.

In case where both registers 60 and 61 store the function code of "0"

The fixed mode of operation is established in the A/D converter circuit 33, and the multiplexer 35 is transparent for one of the analog signals on the input node specified by the selecting signal 55. Assuming now that the input node 47 is selected by the selecting signal 55, produced by the nodeselecting code stored in the node register 62, the analog voltage signal on the input node 47 is transferred to the A/D converting unit 36. In response to the timing signals 63, the A/D converting unit 36 repeats a series of steps of sampling the analog voltage signal on the node 47, converting the sampled analog voltage into digital data bits, then storing the digital data bits into the corresponding register 37. Whenever the digital data bits are stored into the register 37, the controlling unit 45 activates the interrupt requesting signal 59. The central processing unit 32 is thereby branched to the interrupt service subroutine, so that the digital code in the register 37 is fetched by the central processing unit 32. Thus, the controlling unit 45 focuses the A/D converting unit 36 on the analog voltage signal on the input node 47, and allows the A/D converting unit 36 to repeat the A/D operation on the analog voltage signal.

In case where the registers 60 and 61 respectively store the function codes of "1" and "0"

The scanning mode of operation is established in the A/D converter circuit 33, and, accordingly, the node-selecting code in the register 62 is ignored.

The multiplexer 35 sequentially transfers the analog voltage signals from the input node 47 to the input node 54, and returns to the input node 47 again for repetition. With the analog voltage signals, the A/D converting unit 36 produces the digital signals which are memorized in the registers 37 to 44 assigned by the address signal, respectively. When one cycle of the A/D converting operations are completed and, accordingly, the digital signals are respectively stored in all of the registers 37 to 44, the controlling unit 45 activates the interrupt requesting signal 75, and allows the multiplexer 35 to sequentially transfer the analog voltage signals on the input nodes 47 to 54 to the A/D converting unit 45. In response to the interrupt requesting signal over line 59, the central processing unit 32 reads the digital data bits from the registers 37 to 44 through the bus system 34.

In case where the register 61 stores the function code of "1"

The content of the register 60 is ignored. In response to the register 61 written with the code of "1", the A/D converter circuit performs the fixed mode of operation once and then turns to the scanning mode of operation. However, in this scanning mode, the interrupt request signal 59 is masked, i.e., is not generated. More specifically, when the central processing unit 32 performs an operation of writing the function code of "1" to the function register 61, the detector circuit 46 detects this operation and produces a detecting signal 70 of an active high level. With the detecting signal 70 of the active high level, the controlling circuit 45 allows the A/D converting unit 36 to produce digital data bits responsive to the analog voltage signal on one of the input nodes 47 to 54 specified by the selecting signal 55 responsive to the selection code of the register 62. The digital data bits thus produced are stored into the associated one of the registers 37 to 44, and the controlling unit 45 produces the interrupt requesting signal 59. The digital data bits are thereby fetched by the central processing unit 32 in the interrupt service routine. The A/D converter circuit 33 thereafter turns to the scanning mode of operation, and executes this operation without generating the interrupt requesting signal 59. When the conversion request signal 58 is supplied to the unit 45 from the central processing unit 32 or the outside while the function register 61 stores the function code of "1", the operation mode described above takes place in the A/D converter circuit 33 with the shifting signal of the active high level.

In this manner, when it is necessary to convert the analog voltage signal on a certain input node into the corresponding digital data bits, the central processing unit 32 writes the code representative of the input node into the register 62, and, further, provides the function code of "0" into both of the registers 60 and 61. If, on the other hand, all of the analog voltage signals be periodically converted into the corresponding digital data, respectively, the function code "1" and the function code of "0" are written into the registers 60 and 61, respectively. Moreover, whenever a certain analog voltage signal should be converted into the corresponding digital data bits once, the central processing unit the selecting code indicative of the analog voltage signal is written into the register 62, and the function code of "1" is written into the register 61.

While the central processing unit 32 executes a series of programmed instruction codes, the A/D conversion subroutine call takes place, and a certain analog input voltage signal is requested to be converted into the corresponding digital data code once in the subroutine call. The central processing unit 32 transfers the selecting code indicative of the necessary analog voltage signal to the register 62, and writes the function code "1" into the register 61. However, if the selecting code has been written into the register 62, no selecting code is transferred thereto. Furthermore, it is unnecessary for the central processing unit 32 to mask the interrupt requesting signal 59 and recover therefrom, which are associated with the subroutine call in the prior art system. If the A/D conversion requesting signal 58 is supplied in synchronization with an event outside thereof, the analog voltage signal produced upon the event is automatically converted into the digital data bits in so far as the code "1" has been written into the register 61.

Figure 3:
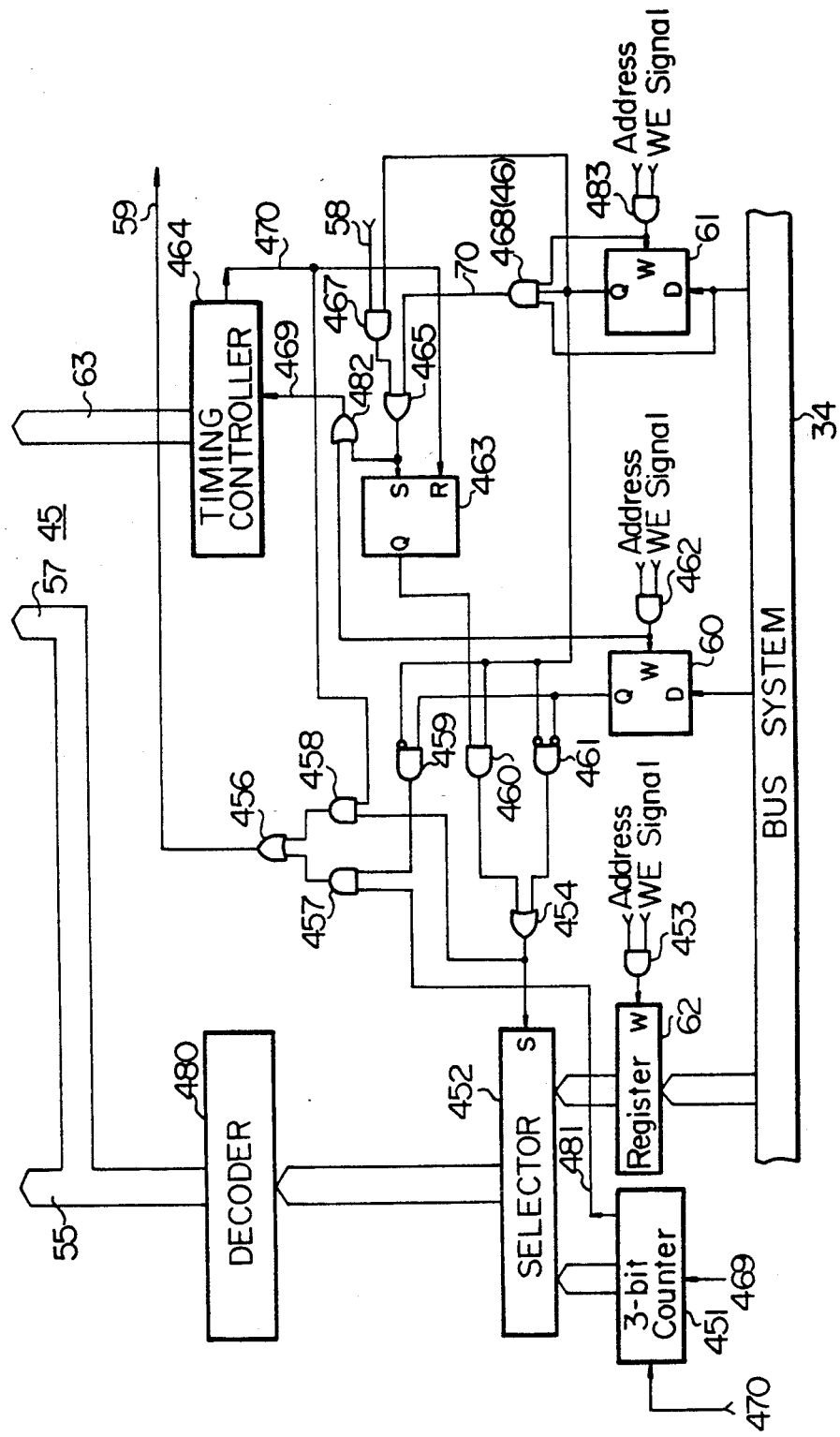

Turning to FIG. 3 of the drawings, the control unit 45 is illustrated in detail. The corresponding component elements are designated by like reference numerals used in FIG. 2 without any detailed description. The control unit 45 further comprises a three-bit counter circuit 469, a selector circuit 452, a decoder circuit 480, a timing controller 464, a S-R flip-flop circuit 463, AND gates 453, 457, 458, 459, 460, 461, 462, 467 and 483, OR gates 454, 456, 465 and 482, and an AND gate 468 serving as the detector 46 in FIG. 2, and these circuits are coupled to one another as shown in FIG. 3.

Assuming now that the function code of "0" is written into the registers 60 and 61, the AND gate 461 produces the output signal of "1" level, however, the AND gates 459 and 460 remain in the "0" level. Then, the output signal of "1" level is supplied from the AND gate 461 through the OR gate 454 to the selecting node S of the selector 452. The selector 452 activates the register 62 to transfer the contents thereof to the decoder circuit 480, and the decoded signal is fed from the decoder circuit 480 to the multiplexer 35 and the registers 37 to 44 in FIG. 2.

When the function code of "0" is written into the register 60, the AND gate 462 produces the output signal of "1" level which in turn is supplied via the OR gate 482 to the timing controller 464 as the A/D conversion activation signal 469. The controller 464 is initialized with the signal 469, and supplies the timing signal to the A/D conversion unit 36 in FIG. 2. The timing controller 464 produces a complete signal 470 upon completion of the single A/D converting operation. The complete signal 470 is supplied to the AND gate 458, and the interrupt requesting signal 59 is produced via OR gate 456, because the OR gate produces the output signal of "1" level. Thus, whenever the function code of "0" is written into the registers 60 and 61, one of the analog signals is selected depending upon the node selecting code stored in the register 62, and is continuously converted into the corresponding digital data bits.

If the function codes of "1" and "0" are respectively written into the registers 60 and 61, the AND gate 459 produces the output signal of "1", the AND gates 460 and 461 produces the respective output signals of "0" level, and, accordingly, the OR gate 454 produces the output signal of "0" level. In this situation, the selector 452 selects the three-bit counter circuit 451. With the reset signal or the activation signal 469 produced upon write-in operation on the register 60, the counter circuit 451 increments the value stored therein with the A/D conversion complete signal 470, and an overflow signal 481 is supplied from the counter circuit 451 to the AND gate 457, and the output signal thereof is supplied to the OR gate 456 to produce the interrupt requesting signal 59. Whenever the function codes of "1" and "0" are written into the registers 60 and 61, all of the analog voltage signals on the respective input nodes 47 to 54 are sequentially converted to the corresponding digital data, and the interrupt requesting signal 59 is produced upon completion of every cycle.

When the function code of "1" is written into the register 61, the AND gate 468 detects the write-in operation, and, then, produces the detecting signal 70. The detecting signal 70 is supplied to the OR gate 465 the output signal of which is used for setting the flip-flop circuit 463 and is further used for initializing the controller 464. Since the flip-flop circuit 463 is shifted to the set-state, the AND gate 460 produces the output signal of "1" level, and, accordingly, the selector circuit 452 selects the register 62. For this reason, the analog voltage signal indicated by the contents of the register 62 is converted to the corresponding digital data bits, and the converted digital data bits are memorized in the corresponding register. Moreover, the conversion complete signal 470 is produced and allows the series combination of the AND gate 458 and the OR gate 456 to produce the interrupt requesting signal 59. The interrupt requesting signal 59 is supplied to the central processing unit 32 of FIG. 2, and the flip-flop is shifted to the reset-state. When the flip-flop 463 is shifted to the reset-state, the AND gate 460 shifts the output signal to the "0" level, and, accordingly, the OR gate 454 shifts the output signal to the "0" level, thereby causing the selector circuit 452 to select the counter circuit 451. As a result, the A/D converter 33 proceeds to the sequential A/D converting operations on all of the analog voltage signals. Upon completion of every A/D converting operation, no interrupt requesting signal 59 is produced even if the complete signal 470 or the overflow signal 481 take place, because the AND gates 457 and 458 are closed. When the A/D conversion requesting signal 58 is supplied thereto in the presence of the function code "1" stored in the register 61, the series combination of the AND gate 467 and the OR gate 465 sets the flip-flop circuit 463, and, for this reason, the third operation mode is established in the A/D converter.

In this instance, when the third operation mode is established, the analog voltage signal indicated by the node selecting code in the register 62 is converted into the corresponding digital data bits once, however, the analog voltage signal tends to contain unavoidable error and undesirable noises. For eliminating these error and noises, it is desirable to take an average of a plurality of the digital data converted from the same analog voltage signal. In order to take the average, the analog voltage signal should be repeatedly converted into the plural digital data, and this operation mode (the fourth operation mode) is supplemented to another implementation which is described hereinbelow.

Second embodiment

Figure 4:
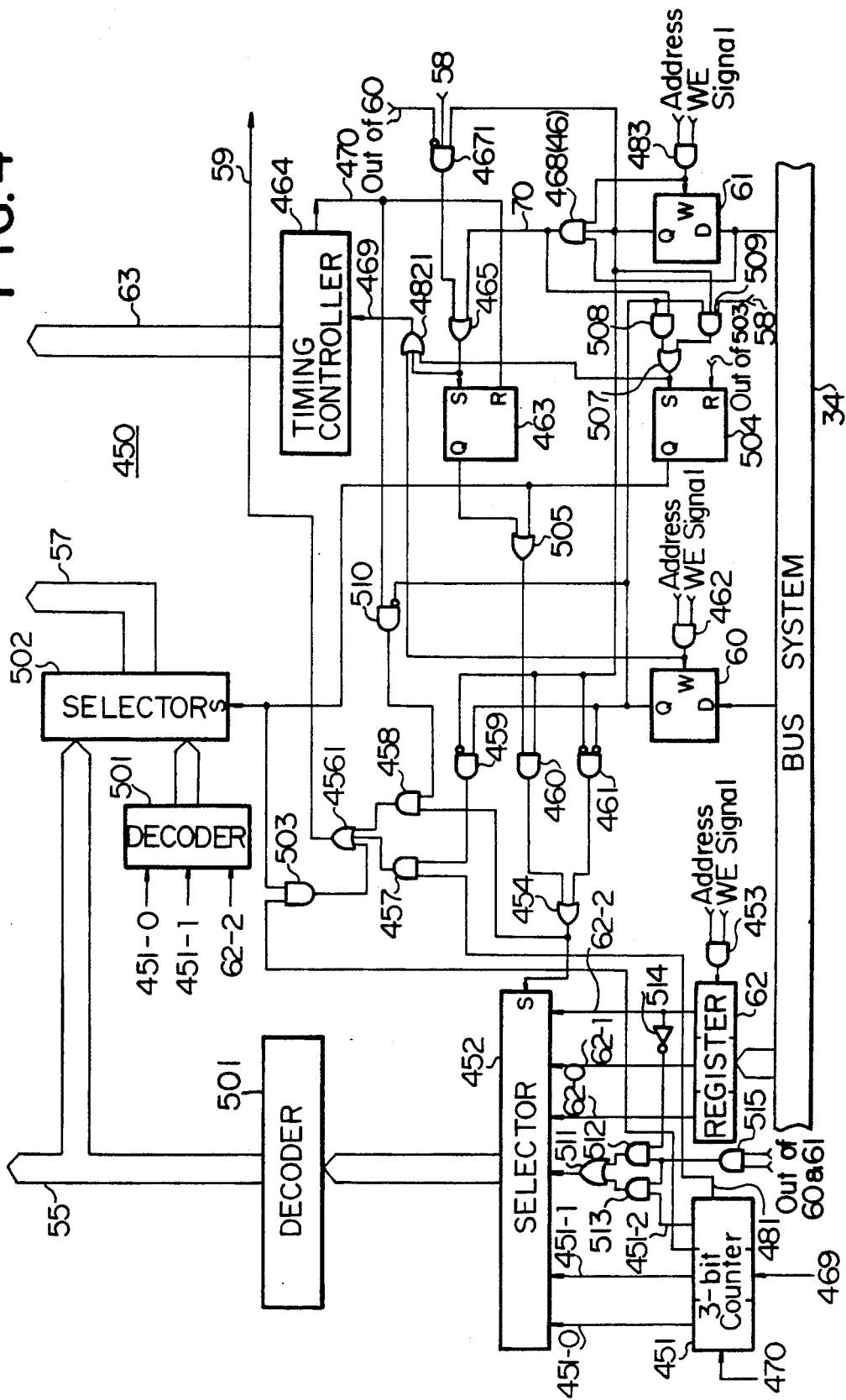
FIG. 4 is a circuit diagram representative of an A/D conversion controlling unit according to another embodiment of the present invention.

The microprocessor with built-in A/D converter has not only the first to third operation modes but also the fourth operation mode, however, the general arrangement is similar to that illustrated in FIG. 1 except for a control unit 450, so that description is hereinbelow made for the control unit 450 with reference to FIG. 4, but no further description for the other component blocks is incorporated. In FIG. 4, the component circuits and blocks corresponding to those in FIGS. 2 and 3 are denoted by like reference numerals for the sake of simplicity.

The control unit 450 shown in FIG. 4 comprises a decoder 501, a selector 502, a S-R flip-flop circuit 504, AND gates 508, 509, 510, 512, 513 and 515, OR gates 507 and 511, and inverter circuit 514, and these component circuits are arranged to be coupled to one another as shown in FIG. 4. The decoder 501 is supplied with the two lower order bits 451-0 and 451-1 as well as the highest order bit 62-2 of the register 62. The OR gates 456 and 482 and the AND gate 467 in FIG. 3 are replaced with three-input OR gates 4561 and 4821 and a three-input AND gate 4671, respectively.

When the function codes of "0" level is written into the registers 60 and 61, the AND gate 461 produces the output signal of "1" level. The flip-flop circuits 463 and 504 remain in the respective reset-states. For this reason, the selector 452 selects the register 62, the selector 502 selects the decoder circuit 480. As a result, the analog voltage signal specified by the code stored in the register 62 is repeatedly converted into the digital data, and the digital data are successively memorized in the registers 37 to 44 of FIG. 2. Moreover, the interrupt requesting signal 59 is produced upon completion of every A/D converting operation.

When the function codes of "1" level and "0" level are respectively written into the registers 60 and 61, only the AND gate 459 produces the output signal of "1" level, and the OR gate 454 produces the output signal of "0" level. The flip-flop circuit 463 produces the output signal of "0" level at the Q node thereof, and the AND gate 515 produces the output signal of "0" level. The highest order bit of the counter circuit 451 is transferred through the AND gate 513 and the OR gate 511 to the selector circuit 452. The selector 452 selects the three-bit output signal of the counter 451, and the selector 502 selects the output signal of the decoder circuit 480. The analog voltage signals on the eight input nodes are successively converted into the corresponding digital data which are transferred to the registers 37 to 44 (in FIG. 2) for memorization. When one cycle of the A/D converting operations is completed, the overflow signal 481 is supplied from the counter circuit 451, and the interrupt requesting signal 59 is fed to the central processing unit 32.

If the function codes of "0" level and "1" level are written into the registers 60 and 61, respectively, the AND gate 468 detects the write-in operation of the "1" level carried out for the register 61, and the detecting signal 70 is produced therein. The detecting signal 70 is used to shift the flip-flop circuit 63 into the set-state. However, the flip-flop circuit 504 is not shifted into the set-state due to the AND gate 508. When the flip-flop circuit 463 is shifted into the set-state, the AND gate produces the output signal of "1" level, and the OR gate 454 produces the output signal of "1" level. The selector 452 selects the register 62. The flip-flop circuit 504 is not shifted into the set state, selector 502 selects the decoder 480. Then, the analog voltage signal indicated by the node selecting code in the register 62 is converted into the corresponding digital data bits which is transferred to the corresponding register of the register group 37 to 44 in FIG. 2. The conversion complete signal 470 is produced, and, accordingly, the interrupt requesting signal 59 takes place with the complete signal 470, because the gates 510 and 458 are opened. The complete signal 470 is further used for shifting the flip-flop circuit 463 into the reset-state, thereby allowing the OR gate 454 to produce the output signal of "0" level. As a result, the selector 452 selects the counter 469, and, for this reason, the A/D converting operations are repeatedly carried out for all of the analog input signals. However, no interrupt requesting signal takes place upon production of the overflow signal 481, because the AND gate 457 remains in the inactive state.

Finally, if the function code of "1" level is written into the registers 60 and 61, the detecting signal 70 is supplied through the AND gate 508 and the OR gate 507 to the flip-flop circuit 504 to shift into the set-state. The detecting signal 70 is further used to shift the flip-flop circuit 463 into the set-state. The OR gate 505, the AND gate 460 and the OR gate 454 respectively produces the output signals of "1" level, and the selector 452 selects the register 62 so as to transfer the contents thereof to the decoder circuit 480. If the flip-flop circuit 504 is shifted to the set-state, the selector 502 selects the second decoder 501. The decoder circuit 501 is supplied with the lower order two bits 451-0 and 451-1 and the highest order bit 62-2 of the register 62, and the counter circuit 451 is shifted into the reset-state with the A/D conversion activation signal 469. The decoder 501 is supplied with the bit string of "000" or "001" depending upon the contents of the register 62. In detail, if the node selecting code is stored in the register 62 for selecting one of the input nodes 47 to 50, the bit string "000" is supplied to the decoder 501 for specifying the register 37. However, if one of the analog inputs 51 to 54 is specified, the bit string "001" specifies the register 41. Assuming now that the contents of the register 62 specifies the analog input 49, the A/D conversion data bits are memorized in the register 37. When a single A/D converting operation is completed, the signal 470 takes place, and the counter circuit 469 is incremented by one, so that the bit string "100" is supplied to the decoder 501. The signal 470 is used for shifting the flip-flop circuit 463 into the reset-state, however, the flip-flop circuit 504 is not shifted into the reset-state, the OR gate 505 allows the OR gate 454 to produce the output signal of "1" level. Since the AND gate is not activated, the interrupt requesting signal 59 does not take place even if the signal 47 0 is supplied. Since the selector 452 continues to select the register 62, the A/D converting operation is repeated again for the analog input 49. and the corresponding digital data bits are memorized in the register 38. In the similar manner, the A/D converting operation is repeated twice for the analog input 49, and the corresponding digital data are memorized in the registers 39 and 40, respectively. With the signal 470 produced upon completion of the fourth A/D converting operation, the highest order bit 451-2 of the counter 469 becomes to be "1" The AND gate 503 is activated with the Q output of the flip-flop circuit 504, and, for this reason, the bit 451-2 of "1" level causes to produce the interrupt requesting signal 59 which is supplied to the central processing unit 32. The output signal of the AND gate 503 is further supplied to the reset node of the flip-flop circuit 504, so that the flip-flop circuit 504 is shifted to the reset-state. The OR gate 505 produces the output signal of "0" level which allows the OR gate 454 to produce the output signal of "0" level. As a result, the selector 452 selects the counter 469. In this situation, the AND gate 515 produces the output signal of "1" level which allows the AND gate 512 to be activated. Since the AND gate 513 remains in the inactive state, the highest order bit of the register 62 is inverted and supplied to the selector 452. This results in that the bit string "001" is supplied to the selector 452, and the analog input 51 is specified. Moreover, the register 41 is selected. In this way, the A/D converting operations are sequentially carried out for the analog inputs 51 to 54. Since the output signals of the AND gates 503, 457 and 458 are at a logic "0" level, no interrupt requesting signal 32 is generated.

If the A/D conversion requesting signal 58 is supplied in the co-presence of the function codes of "0" level and "1" level respectively stored in the registers 60 and 61, the AND gate 4671 produces the output signal of "1" level which establish the A/D converter into the third operation mode.

If the A/D converting signal 58 is supplied in the copresence of the function codes of "1" level stored in the registers 60 and 61, the AND gate 509 produces the output signal of "1" level to cause the A/D converter to enter the fourth operation mode.

In this instance, the A/D converter is established into one of the four modes of operation, and it is not necessary for the central processing unit 32 that the interrupt requesting signal 59 is masked and recovered therefrom.

Although particular embodiments of the present invention have been shown and described, it will be obvious to those skilled in the art that various changes and modifications may be made without departing from the spirit and scope of the present invention. For example, the present invention may be applicable to a one-chip microcomputer with built-in A/D converter in which a program memory and a working memory are incorporated together with a central processing unit. In the second mixed mode of the operation, the A/D converting operation may be repeated a predetermined number of times except for four.

What is claimed is:

1. A data processor comprising:
   a central processing unit;
   a plurality of analog input nodes;
   analog input selecting means coupled, respectively, with said plurality of analog input nodes, and operative to select one of said analog input nodes;
   an analog-to-digital converting unit coupled with said analog input selecting means, and operative to convert an analog signal at the analog input node selected by said analog input selecting means into a digital code;
   a plurality of registers coupled with said analog-to-digital converting unit, each register operative to store said digital code;
   a function register coupled to the central processing unit for storing function codes needed to operate in a selected mode;
   analog-to-digital mode conversion activating means coupled with said function register, said analog input selecting means and said analog-to-digital converting unit, and responsive to said function code to allow automatic entry into a scanning mode upon completion of a fixed mode, and operative by producing selecting signals for sequentially indicating said plurality of analog input nodes to cause said analog-to-digital converting unit to carry out analog-to-digital converting operations in said scanning mode operation on analog signals received at each of said analog input nodes without rewriting said function code from said central processing unit upon completion of the analog-to-digital converting operation in said fixed mode operation on the analog signal at one of said input nodes specified by said analog input selecting means, and a shared bus coupled between said central processing unit, said plurality of registers and said analog-to-digital conversion activating means for allowing said central processing unit to communicate with said plurality of registers and with said analog-to-digital conversion activating means.

2. A microcomputer comprising:

an analog-to-digital converting circuit, a central processing unit, and a data bus for allowing said central processing unit to communicate with said analog-to-digital converting unit, said analog-to-digital converting circuit comprising:

a plurality of input nodes respectively supplied with a plurality of analog signals, converting means for converting each of said plurality of analog signals into digital data, and producing a finishing signal upon completion of each of said plurality of analog signals, a plurality of data registers, including a first register temporarily storing a designating data value for designating one of said plurality of analog signals to be converted, a second and a third register for temporarily storing function mode data for designating a fixed mode or scanning function, said first and second registers being coupled with said data bus for write-in and read-out operations;

generating means for producing a scan designating value for sequentially designating at least analog signals selected from said plurality of analog signals, and controlling means responsive to said function mode data to allow automatic entry into said scanning mode upon termination of said fixed mode, and causing said converting means to sequentially convert said analog signals after one of said plurality of analog signals is converted into the digital data without rewriting said function mode data from said central processing unit, said controlling means having:

first supplying means designating said one of said plurality of analog signals on the basis of said designating data stored in said first register, and supplying said one of said plurality of analog signals to said converting means, writing means for writing said digital data converted from said one of said plurality of analog signals into one of said plurality of data registers, and second supplying means responsive to said finishing signal produced upon completion of the analog-to-digital conversion from said one of said plurality of analog signals into said digital data, and sequentially supplying each of said analog signals to said converting means on the basis of said scan designating value fed from said generating means.

3. A microcomputer as set forth in claim 2, in which said controlling means further includes an interrupt requesting means responsive to said finishing signal produced upon said completion of said analog-to-digital conversion from one of said plurality of analog signals to said digital data, and supplies a request for interrupt to said central processing unit, and a masking mean responsive to said finishing signal produced upon completion of sequential analog-to-digital conversions from said analog signals into a plurality of digital data, and masks said request for interrupt to said central processing unit for allowing said central processing unit to continue a program sequence.

4. A microcomputer as set forth in claim 3, in which said generating means are further operative to initialize said scan designating value in response to said finishing signal.

5. A microcomputer comprising an analog-to-digital converting circuit and a central processing unit, said analog-to-digital converting circuit comprising:

a plurality of input nodes respectively supplied with a plurality of analog signals;

converting means converting each of said plurality of analog signals into digital data, and producing a finishing signal indicative of completion of such analog-to-digital conversion;

a plurality of data registers;

a first register temporarily storing designating data for designating one of said plurality of analog signals to be converted;

a second register temporarily storing function mode data for designating a fixed mode or a scanning mode function;

generating means producing scan designating data for sequentially designating analog signals selected from said plurality of analog signals; and controlling means responsive to said function mode data to allow automatic entry into said scanning mode upon termination of said fixed mode, and causing said converting means to repeat said analog-to-digital conversion on one of said analog signals into the digital data predetermined number of times for producing a predetermined number of the digital data, said controlling means further causing said converting means to sequentially convert said analog signals into a plurality of digital data after repetition of said analog-to-digital conversion, said controlling means so operating without rewriting said function mode data and having:

first supplying means designating said one of said plurality of analog signals on the basis of said designating data stored in said first register, and supplying said one of said plurality of analog signals to said converting means until completion of said repetition;

writing means for writing said predetermined number of said digital data converted from said one of said plurality of analog signals into data registers selected from said plurality of data registers; and second supplying means responsive to said finishing signal produced upon completion of said repetition of said analog-to-digital conversion, and sequentially supplying said analog signals to said converting means on the basis of said scan designating data fed from said generating means.

6. A microcomputer as set forth in claim 2, in which said controlling means further includes an interrupt requesting means responsive to said finishing signal produced upon said completion of said conversion from one of said plurality of analog signals, and supplies a request for interrupt to said central processing unit, and a masking mean responsive to said finishing signal, produced upon completion of sequential analog-to-digital conversions from said analog signals into a plurality of digital data, and masks said request for interrupt to said central processing unit for allowing said central processing unit to continue a program sequence.

7. A microcomputer as set forth in claim 6, in which said generating means are further operative to initialize said scan designating value in response to said finishing signal.

8. A data processor fabricated on a single semiconductor chip, comprising:
   an analog-to-digital converting unit selectively entering a fixed mode or a scanning mode of operation,
      a plurality of input nodes to which a plurality of analog input signals are respectively supplied,
      an analog-to-digital converter for converting an analog data signal to a digital data signal during an analog-to-digital converting cycle,
      a plurality of data registers coupled with said analog-to-digital converter, for writing thereinto a plurality of digital data signals sequentially supplied from said analog-to-digital converter,
   a multiplexer responsive to a selecting signal for selectively coupling said plurality of input nodes with said analog-to-digital converter, and
   a controller having
      a node-selecting register rewriteably storing a control data code indicative of one of said plurality of input nodes for producing said selecting signal indicative of said one of said plurality of input nodes in said fixed mode of operation,
      an incrementing means for producing said selecting signal for sequentially indicating said plurality of input nodes in said scanning mode,
      a mode controlling means including a function register for rewriteably storing a function code indicative of one of a first state, a second state and a third state, said fixed mode being repeated in said fist state, said scanning mode being repeated in said second state, said fixed mode being automatically followed by said scanning mode without rewriting said function code in said third state,
      a request signal producing means for producing a request signal upon completion of every write-in operation on one of said plurality of data registers in said fixed mode under said first state, upon completion of a series of write-in operations on said plurality of data registers in said scanning mode under said second state and upon completion of said fixed mode under said third state; and
   a central processing unit coupled with said analog-to-digital converting unit through a bus system, for supplying said control data code and said function code through said bus system to said node-selecting register and said mode controlling means when executed instruction codes request, said central processing unit being responsive to said request signal for fetching one of or said plurality of digital data signals stored in said plurality of data registers.

9. A data processor as set forth in claim 8, in which said third state has a first sub-state for carrying out said first mode once, and a second sub-state for repeating said first mode a predetermined number of times.

10. A data processor as set forth in claim 8, further comprising an addressing means for producing an address signal indicative of one of said plurality of data registers, said one of said plurality of data registers being unchanged in said first state, said address signal being changed in synchronism with said selecting signal in said second state, said address signal being indicative of a predetermined one of said plurality of data registers in said fixed mode under said first sub-state, said address signal being sequentially indicative of data registers selected from said plurality of data registers in said fixed mode repeated in said second sub-state, said address signal being changed in synchronism with said selecting signal in said scanning mode under said third state.

11. A data processor as set forth in claim 8, in which said incrementing means is implemented by a counter sequentially changing the contents thereof at every write-in operation on said plurality of data registers, said mode controlling means comprising a first function register for storing a first bit of said function code indicative of either the first or second state, a second function register for storing a second bit of said function code indicative of said third state, a first decoder coupled with said first and second function registers for producing a first control signal, a selector having input ports respectively coupled with said node-selecting register and said counter and responsive to said first control signal for selectively coupling one of said input ports thereof with an output port thereof, a second decoder coupled with the output port of said selector for producing said selecting signal, a detector monitoring said second function register for producing a detecting signal indicative of said second bit stored in said second function register, and a shifting means responsive to said detecting signal for causing said first decoder to firstly select said node-selecting register for said fixed mode and said counter upon completion of said write-in operation in said fixed mode.

* * * * *